(12) United States Patent
Lee et al.

(10) Patent No.: US 7,473,597 B2
(45) Date of Patent: Jan. 6, 2009

(54) METHOD OF FORMING VIA STRUCTURES AND METHOD OF FABRICATING PHASE CHANGE MEMORY DEVICES INCORPORATING SUCH VIA STRUCTURES

(75) Inventors: Jang-Eun Lee, Suwon-si (KR);
Sung-Lae Cho, Gwacheon-si (KR);
Jeong-Hee Park, Gwangmyeong-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 243 days.

(21) Appl. No.: 11/201,421

(22) Filed: Aug. 11, 2005

(65) Prior Publication Data

US 2006/0040485 A1 Feb. 23, 2006

(30) Foreign Application Priority Data

Aug. 20, 2004 (KR) ..................... 10-2004-0066074

(51) Int. Cl.
*H01L 21/44* (2006.01)
(52) U.S. Cl. .................. 438/253; 438/238; 438/240; 438/381; 438/396; 257/E21.257; 257/E21.585; 257/E23.145; 257/E45.002
(58) Field of Classification Search ................ 438/597, 438/238, 240, 253, 381, 396, 658; 257/E21.585, 257/E45.002, E21.257, 585, E23.145
See application file for complete search history.

(56) References Cited

U.S. PATENT DOCUMENTS

| | | | |
|---|---|---|---|
| 3,271,591 A | 9/1966 | Ovshinsky | |
| 6,117,720 A | 9/2000 | Harshfield | |
| 6,238,582 B1 * | 5/2001 | Williams et al. | ............... 216/22 |
| 6,635,951 B1 | 10/2003 | Zahorik | |
| 6,831,330 B2 * | 12/2004 | Harshfield | ................. 257/330 |

(Continued)

FOREIGN PATENT DOCUMENTS

CN 1481014 3/2004

(Continued)

OTHER PUBLICATIONS

Office Action for corresponding Korean Application No. 10-2004-0066074 dated Mar. 28, 2006.

(Continued)

*Primary Examiner*—Michael S Lebentritt
(74) *Attorney, Agent, or Firm*—Harness, Dickey & Pierce, PLC (57) ABSTRACT

Provided are methods for forming conductive plug structures, such as via plugs, from a plurality of conductive layer patterns and methods of fabricating semiconductor devices, including semiconductor memory devices such as phase change semiconductor memory devices. An example method forms a small via structure by forming a conductive layer on a semiconductor substrate. A molding insulating layer is formed on the conductive layer and a via hole is formed through the insulating layer to expose a region of the conductive layer. A first via filling layer is formed and then partially removed to form a partial via plug. The formation and removal of the phase change material layer are then repeated as necessary to form a multilayer plug structure that substantially fills the via hole with the multilayer structure typically exhibiting reduced defects and damage than plug structures prepared by conventional methods.

18 Claims, 6 Drawing Sheets

U.S. PATENT DOCUMENTS

| | | | |
|---|---|---|---|
| 6,855,975 B2* | 2/2005 | Gilton | 257/296 |
| 2002/0004278 A1* | 1/2002 | Gutsche | 438/396 |
| 2002/0160551 A1 | 10/2002 | Harshfield | |
| 2002/0179896 A1 | 12/2002 | Harshfield | |
| 2003/0073295 A1 | 4/2003 | Xu | |
| 2003/0087499 A1* | 5/2003 | Lane et al. | 438/396 |
| 2004/0043581 A1 | 3/2004 | Lin et al. | |
| 2006/0046444 A1* | 3/2006 | Campbell et al. | 438/510 |

FOREIGN PATENT DOCUMENTS

| | | |
|---|---|---|
| KR | 10-2003-0086820 | 11/2003 |
| KR | 100458081 | 11/2004 |

OTHER PUBLICATIONS

Office Action for corresponding Chinese Application No. 20051009278.X dated Oct. 11, 2006.

* cited by examiner

METHOD OF FORMING VIA STRUCTURES AND METHOD OF FABRICATING PHASE CHANGE MEMORY DEVICES INCORPORATING SUCH VIA STRUCTURES

PRIORITY STATEMENT

This application claims the benefit of Korean Patent Application No. 2004-66074, filed Aug. 20, 2004, the contents of which are hereby incorporated herein by reference in their entirety.

BACKGROUND OF THE INVENTION

1. Field of the Invention

The invention relates to example methods of fabricating semiconductor devices and, more particularly, to example methods of forming small via structures on a semiconductor device during the process of fabricating a phase change memory device.

2. Description of the Related Art

Non-volatile memory devices share an ability to maintain stored data for a period of time even when the power supply to the memory device is interrupted. Accordingly, non-volatile memory devices are widely utilized computers, mobile communication systems, memory cards, and other applications in which the memory may be powered and accessed infrequently.

Flash memory devices are a class of non-volatile memory devices that typically employ memory cells having a stacked gate structure. The stacked gate structure includes a tunnel oxide layer, a floating gate, an inter-gate dielectric layer, and a control gate electrode which are sequentially stacked on a channel region. The reliability and program efficiency of the flash memory cells can be enhanced by improving the film quality of the tunnel oxide layer and increasing the coupling ratio of the memory cell.

Phase change memory devices are another class of non-volatile memory devices that operate in a different manner than flash memory devices. The basic construction and operation of a phase change memory device utilizes an electrically erasable and programmable phase change material.

A unit memory cell in a typical phase change memory device includes an access device and a data storage element that is connected in series with the access device. The data storage element typically includes a bottom electrode electrically connected to the access device, and a phase change material layer in contact with the bottom electrode. When a write current flows through the access device and the bottom electrode, Joule heat (sometimes referred to as I2R heat) is generated at an interface between the phase change material layer and the bottom electrode. The Joule heat tends to transform the phase change material layer into a more amorphous state or a more crystalline state.

As will be appreciated, this phase change does not need to be a conversion between a completely crystalline state and completely amorphous state, but rather only conversion between two detectable and distinguishable states having a local order within two separate regions falling within the composition spectrum between a completely crystalline state and a completely amorphous state. The phase change material layer will also exhibit a range of electrical characteristics or parameters depending on its structural state as reflected in, for example, an increasing resistance value associated with an increasingly the amorphous state and a decreasing resistance value associated with an increasingly crystalline state.

One drawback associated with phase change memory devices is the relatively high write current values that are required in order to induce a detectable phase change in the phase change material. The need to apply the necessary high write current level tends to limit the degree to which the size, and associated current carrying capacity, of an associated access device and address line used for delivering the write current to each cell can be reduced. The sizing of the access device and address lines will, consequently, tend to determine the degree of integration that can be achieved in a phase change memory device.

One approach for reducing the write current requirements has been directed to utilization of a confined structure in which the phase change material layer is formed in a fine via hole that exposes a region of a bottom electrode for reducing the contact area with the bottom electrode. The phase change memory device having the confined structure provides a reduced volume of material within which the phase change will be induced, thereby increasing the effective current density of the write current through the phase change material. Examples of phase change memory devices incorporating a confined structure are disclosed in U.S. Pat. No. 6,117,720 and U.S. patent publication no. 2003-73295, the contents of which are incorporated herein, in their entirety, by reference and for all purposes to the extent consistent with the disclosure provided below.

In the meantime, in order to enhance the degree of integration in the phase change memory device having the confined structure, the diameter of the via hole that will be filled with the phase change material layer should be decreased. For example, in order to fabricate a highly integrated phase change memory device of 256-megabyte class, the via hole should be formed to have a diameter of about 50 nm or less. Typically, however, the phase change material layer is deposited using a sputtering method that tends to exhibit relatively poor step coverage that tends to complicate with efforts to uniformly fill fine via holes with the phase change material layer.

In particular, during conventional sputtering deposition, an overhanging region of material tends to form around the upper edge or lip of the via hole as the phase change material layer is being deposited. This overhanging region increases the likelihood that defects such as voids may be created within the phase change material layer filling the via hole. The likelihood of such defects also tends to increase as the aspect ratio of the via hole increases, e.g., where the diameter of the via hole is decreased while the via hole depth remains relatively unchanged.

In addition, as described in U.S. Pat. No. 6,117,720, a chemical mechanical polishing (CMP) process may be utilized to define the phase change material layer within the via hole. However, if the phase change material, for example an alloy containing germanium-antimony (sometimes referred to as stibium)-tellurium (GST), is volatile or otherwise overly susceptible to the CMP process, excessive amounts of the material can be removed during the CMP process. One approach for addressing this issue is outlined in U.S. patent publication no. 2003-73295, in which the loss of the phase change material layer during the CMP process may be reduced by forming the top electrode layer on the GST alloy layer filling the via hole and then anisotropically etching the conductive (electrode) layer and the phase change material layer to form a stacked structure.

During such an anisotropic etch process, however, the exposed side portions of the GST alloy layer may suffer varying degrees of etch damage. In particular, as the size of the GST alloy layer pattern is decreased to improve the degree of integration of the phase change memory device, the GST alloy layer pattern tends to become more susceptible to etch damage, thereby increasing the likelihood that the operating characteristics of the phase change memory device may be degraded and reduce the process yield and/or reliability of the resulting memory devices.

SUMMARY OF THE INVENTION

Example embodiments of the invention provide methods for forming via structures having an improved capability for forming reliable via plugs within fine via holes.

Other example embodiments of the invention provide methods for fabricating phase change memory devices in which the via plugs formed from a phase change material layer within a small via hole exhibit improved reliability.

Still other example embodiments of the invention provide methods for fabricating phase change memory devices that omit anisotropic etching of the a phase change material layer and thereby reduce degradation of the operating characteristics of the phase change memory device.

Yet other example embodiments of the invention provide methods for fabricating more highly integrated phase change memory devices.

An example method according to the invention includes forming a conductive layer on a semiconductor substrate. A conformal or molding insulating layer is then formed to cover the conductive layer. A via hole exposing a region of the conductive layer is then formed through the molding insulating layer. A via filling layer is then formed on the molding insulating layer, and on an inner sidewall and a bottom surface of the via hole. A portion of the via filling layer adjacent an upper lip or edge region of the via hole is then removed to form a via filling layer pattern remaining at least on a bottom surface of the via hole. The processes of forming the via filling layer and the via filling layer pattern are sequentially and repeatedly performed at least once to form a via plug in the via hole.

In the example embodiments detailed herein, the via filling layer may be removed using an ion beam etching process (sometimes referred to as ion milling) in which an energetic ion beam is directed at the via filling layer while inclined at an incident angle with respect to an open axis of the via hole. The ion beam will typically be configured with an incident angle sufficient to prevent the ion beam from being directly incident on the bottom surface of the via hole and frequently at least a lower portion of the via hole sidewall. As will be appreciated, the range of suitable incident angles will tend to increase as the aspect ratio of the via holes increases. Depending on the aspect ratio of the via holes, it is anticipated that ion beams having an incident angle in a range of 30° to 85° may be satisfactory for use in this method.

In some example embodiments, the process utilized for removing the portion of the via filling layer formed adjacent the upper lip or edge of the via hole may maintained for a time and under process conditions sufficient to expose a top surface of the molding insulating layer.

Alternatively, embodiment of the process may, for example, include a modified version of the ion etching or milling process used to remove an upper portion of the via filing layer formed adjacent the upper lip or edge of the via holes. In this alternative embodiment, the ion etch process is terminated before all of the via filling layer has been removed, thereby producing a via filling layer that maintains a reduced thickness on a top surface of the molding insulating layer after the etch. In this instance, the portion of the via filling layer that remains on the molding insulating layer at this point in the process may be subsequently removed during final formation of the via filling layer pattern.

In other embodiments of the process, for example, a top conductive layer that is in electrical and thermal contact with the via plug may be formed on the molding insulating layer and the upper surface of the via plug after forming the via plug.

Another example embodiment of the invention is directed to methods of fabricating a phase change memory device that include forming an interlayer insulating layer on a semiconductor substrate, forming a bottom electrode on the interlayer insulating layer. A molding insulating layer may then be formed on the interlayer insulating layer to cover the bottom electrode. A via hole sized and oriented to expose a region of the bottom electrode is then formed through the molding insulating layer. A phase change material layer is formed on the molding insulating layer as well as on an inner sidewall and a bottom surface of the via hole.

The portion of the phase change material layer formed adjacent the upper lip or edge of the via hole is then removed to form a phase change material layer pattern that includes at least a portion of the phase change material that remains on at least the bottom surface of the via hole, i.e., initially defined by an upper surface region of the bottom electrode. The processes for forming the phase change material layer and the phase change material layer pattern are performed sequentially, and are repeated at least once and perhaps multiple times, to form a single via plug from at least two separate phase change material layer patterns within the via hole.

BRIEF DESCRIPTION OF THE DRAWINGS

Example embodiments of the invention will be apparent from the more particular description of certain example embodiments of the invention provided below and as illustrated in the accompanying drawings.

These drawings have been provided to assist in the understanding of the example embodiment's of the invention as described in more detail below and should not be construed as unduly limiting the invention. In particular, the number, relative spacing, positioning, sizing and dimensions of the various elements illustrated in the drawings are not drawn to scale and may have been exaggerated, reduced or otherwise modified for the purpose of improved clarity. Further, as will be appreciated by those skilled in the art, in some instances a referenced layer can be formed from several sublayers that can have substantially identical thicknesses and/or compositions that include random or deliberate and systematic variation in the thicknesses and/or compositions. Similarly, a referenced "layer" can be considered to be formed "on" another layer or a substrate whether formed directly on the referenced lower layer or the substrate or whether formed at least partially on other intervening layers or patterns overlaying the referenced layer. Accordingly, an upper layer may properly be referenced as being formed "on" another lower layer even in instances when an intervening layer prevents any direct contact between the referenced upper and lower layers.

DETAILED DESCRIPTION OF EXAMPLE EMBODIMENTS

Example embodiments of the invention will now be described more fully hereinafter with reference to the accompanying drawings, in which certain example embodiments of the invention are illustrated. Those of ordinary skill in the art will also appreciate that a range of alternative configurations have been omitted simply to improve the clarity and reduce the number of drawings. Those of ordinary skill will also appreciate that certain of the various structural elements illustrated or described with respect to the example embodiments may be selectively and independently combined to create other via filling processes and semiconductor device fabrication processes and/or methods useful for manufacturing semiconductor devices without departing from the scope and spirit of this disclosure.

Figure 1:
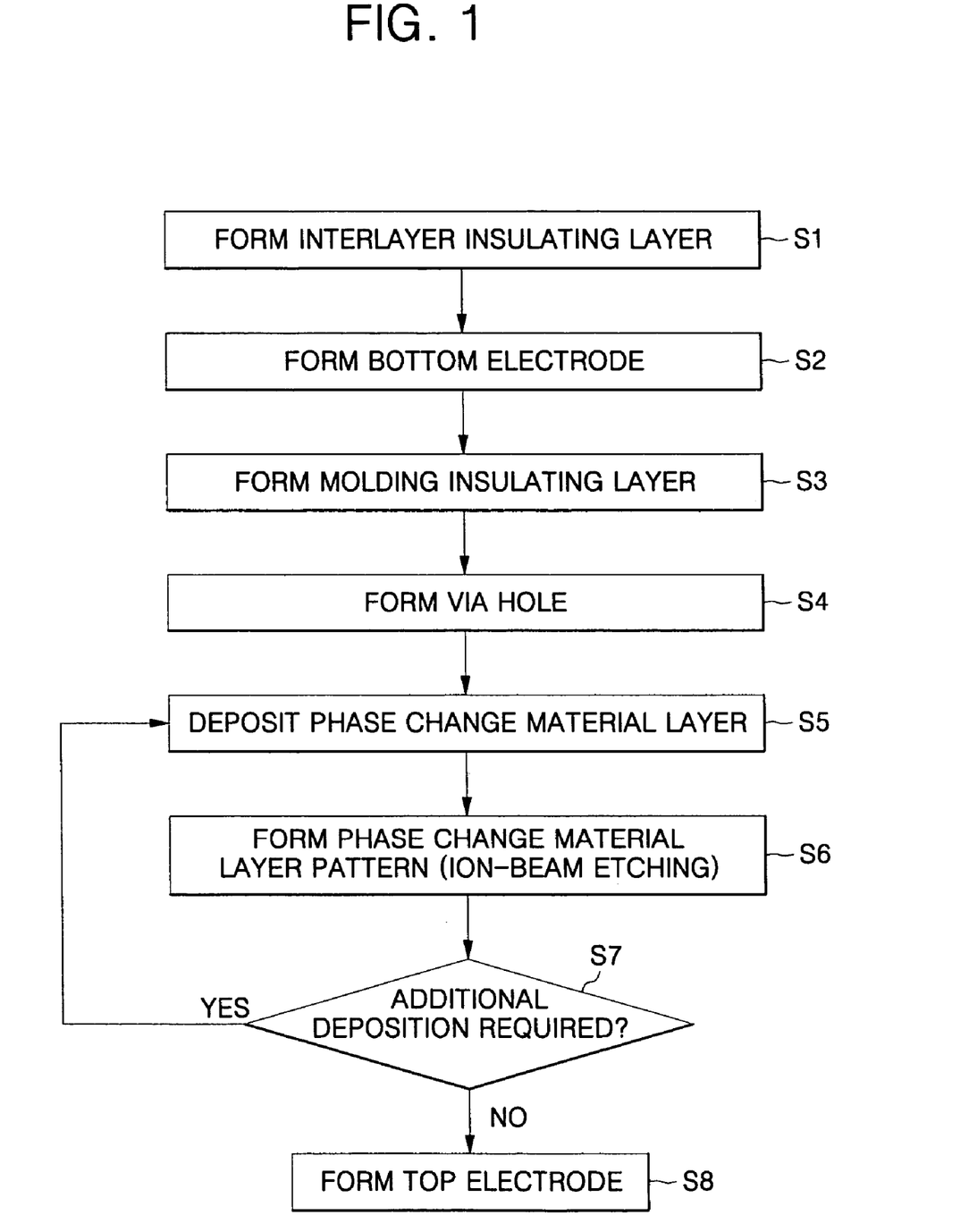
FIG. 1 is a process flow chart corresponding to a method of fabricating a phase change memory device in accordance with an example embodiment of the invention.

FIG. 1 is a process flow chart illustrating an example method of fabricating a phase change memory device in accordance with an example embodiment of the invention. In addition, FIGS. 2 to 8 are cross-sectional views for explaining a method of fabricating a phase change memory device in accordance with an embodiment of the invention.

Figure 2:
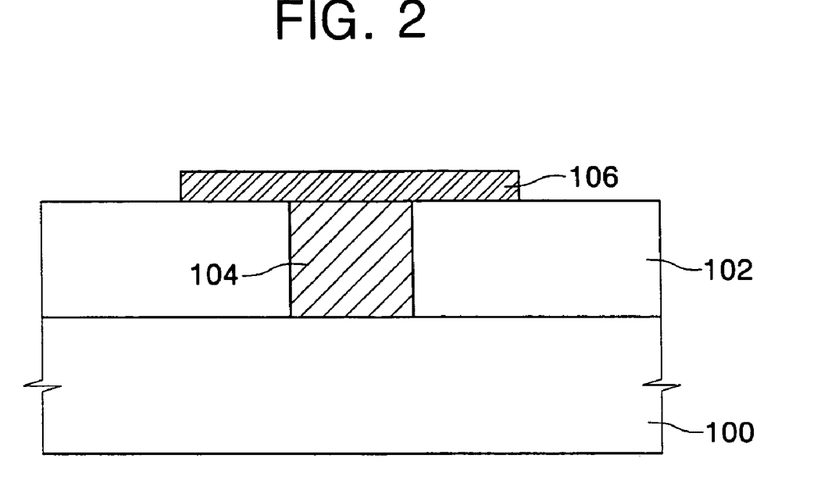
FIGS. 2 to 8 are cross-sectional views corresponding to a method of fabricating a phase change memory device in accordance with another example embodiment of the invention.

As illustrated in FIGS. 1 and 2, an interlayer insulating layer 102 is formed on a semiconductor substrate 100 (S1 of FIG. 1). Although not shown in the Figures, a metal oxide semiconductor (MOS) transistor provided as an access device may be formed on an active region of the semiconductor substrate 100. The interlayer insulating layer 102 may be formed of a silicon oxide layer. A bottom electrode contact plug 104 is formed through the interlayer insulating layer 102 to establish electrical contact with a portion of the substrate 100 such as a source region of an MOS transistor. The bottom electrode contact plug 104 may be formed of titanium nitride (TiN) or titanium aluminum nitride (TiAlN) using a conventional damascene process.

A bottom electrode 106 is then formed on the upper surface of the bottom electrode contact plug 104 and a portion of the interlayer insulating layer 102 that surrounds the bottom electrode contact plug 104 (S2 of FIG. 1). The bottom electrode 106 may be formed by depositing or otherwise forming a conductive layer such as a TiN layer on the interlayer insulating layer 102 and the bottom electrode contact plug 104, patterning the conductive layer and removing those regions of the conductive layer not protected by the pattern to produce the bottom electrode.

Figure 3:
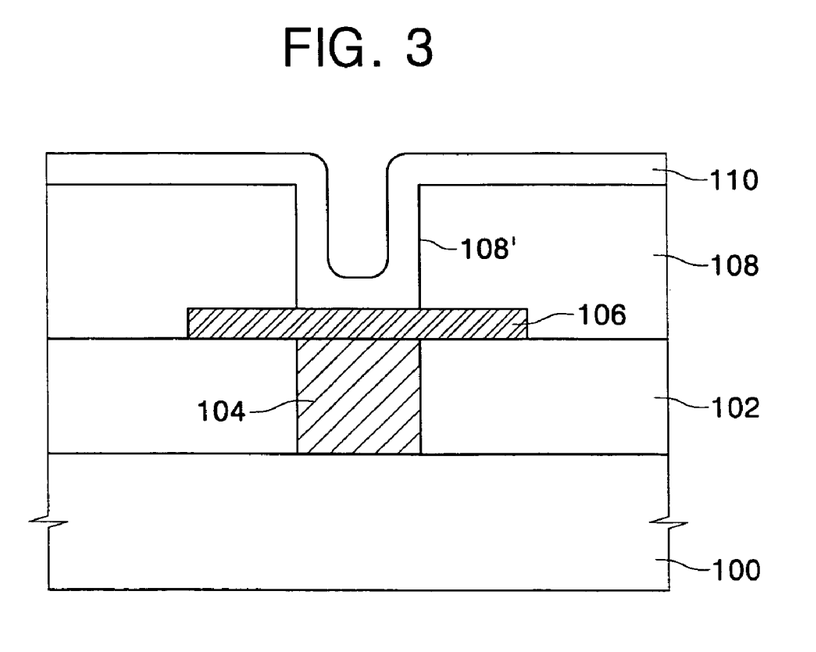

As illustrated in FIGS. 1 and 3, a molding insulating layer 108 is then formed on the interlayer insulating layer 102 and the bottom electrode 106 (S3 of FIG. 1). The molding insulating layer 108 may be formed from one or more of a variety of insulating materials including, for example, silicon oxide, silicon oxynitride and silicon nitride. A via hole or opening is then formed through the molding insulating layer 108 to expose a region of the bottom electrode 106 (S4 of FIG. 1). The process of forming the via hole through the molding insulating layer 108 may utilize a variety of conventional methods known to those skilled in the art.

For example, the via hole may be formed using a combination of conventional photolithography and etching processes suitable for the particular insulating material(s) and the design rules of the particular semiconductor memory device being fabricated. However, in order to form a via hole having a diameter of 50 nm or less for improving the degree of integration of the phase change memory device, several methods may be utilized for complementing the photolithography and etch processes and thereby improving the performance. Examples of such supplemental or complementary methods may include, for example, a photoresist flow technique or a spacer formation technique that will be described in somewhat more detail below.

Again, as illustrated in FIGS. 1 and 3, the molding insulating layer 108 is patterned to form a preliminary via hole 108' that exposes a region of the bottom electrode 104. The molding insulating layer 108 may be patterned by a combination of conventional photolithography and anisotropic etching processes. A conformal spacer insulating layer 110 is then formed on the top surface of the molding insulating layer 108, and an inner sidewall and a bottom surface of the preliminary via hole 108'. The molding insulating layer 108 and the spacer insulating layer 110 are typically formed from different materials. For example, if the molding insulating layer 108 is a silicon oxide layer, then the spacer insulating layer 110 may be a silicon nitride layer.

Figure 4:
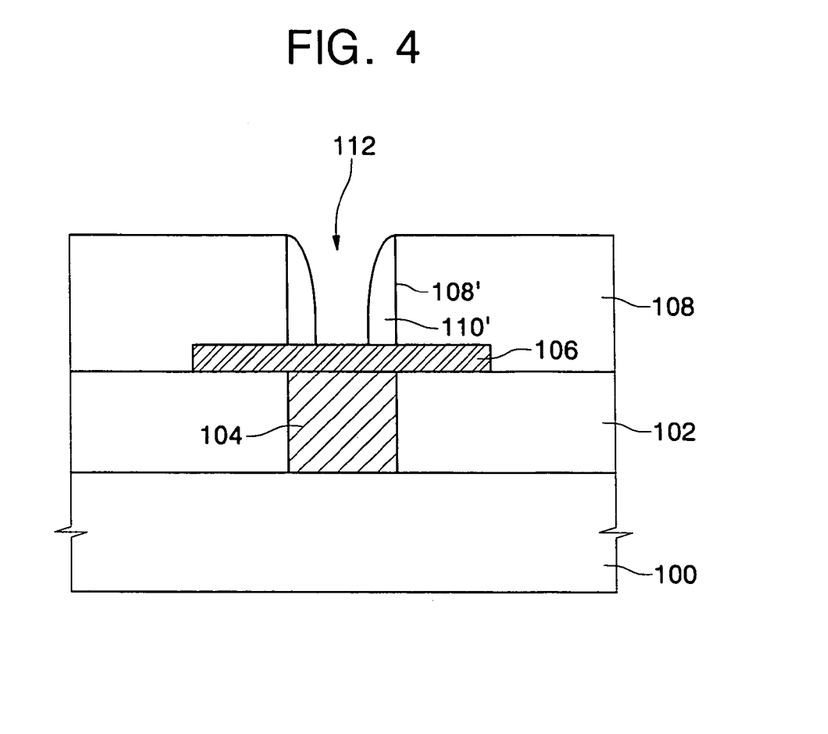

As illustrated in FIGS. 1 and 4, the spacer insulating layer 110 is then anisotropically etched to remove the spacer insulating layer from the surfaces predominately perpendicular to an etch direction while leaving a substantial portion of the spacer insulating layer adjacent vertical surfaces, e.g., the inner sidewall of the preliminary via hole to form a spacer 110' that covers the inner sidewall of the preliminary via hole 108'. As a result, a via hole 112 having a smaller effective diameter than the preliminary via hole 108' can be defined by the spacer 110' formed within the preliminary via hole 108'. As illustrated in FIG. 4, the via hole 112 defined by the spacer 110' may have a positively inclined sidewall profile, i.e., the via hole has a larger diameter toward the surface of the molding insulating layer and a smaller diameter toward the bottom electrode 106.

Figure 5:
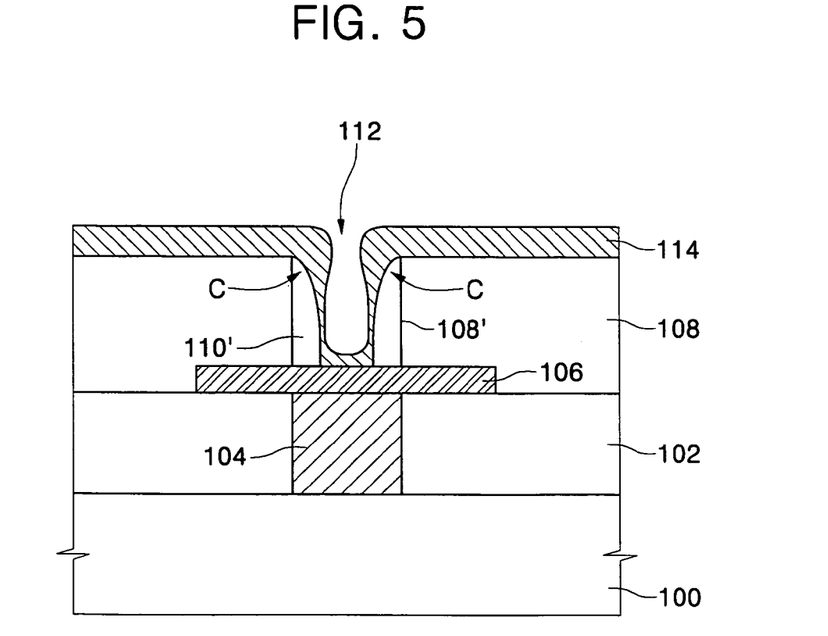

As illustrated in FIGS. 1 and 5, a phase change material layer 114 is then formed on the molding insulating layer 108, and an inner sidewall and a bottom surface of the via hole 112 (S5). The phase change material layer 114 may be formed of a chalcogenide layer. For example, the phase change material layer 46 may be formed of an alloy layer containing germanium (Ge), antimony (Sb), and tellurium (Te), i.e., a having a composition that may be represented by the formula $Te_xSb_yGe_{(1-(x+y))}$ with the variable x and y corresponding to the atomic fraction of the alloy contributed by Te and Sb respectively (also referred to as a GST alloy layer) and satisfying the relationships $0.25 \leq x+y<1$. In this case, the value of x may range from 0.2 to 0.8 and the value of y may range from 0.05 to 0.50, thereby corresponding to GST alloy layers that contain from 20 atomic % to 80 atomic % tellurium (Te), from 5 atomic % to 50 atomic % antimony (Sb), and at least some, but not more than 75 atomic % germanium (Ge). In addition, the phase change material layer 114 may be doped with one or more dopant materials selected from a group consisting of nitrogen and silicon.

Although the discussion above refers to the chalcogenide alloy GST, the invention is not so limited and may include one or more other tertiary and/or quaternary chalcogenide alloys such as arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase-change layer may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimonyselenium (Ta—Sb—Se), niobium-antimony-selenium (Nb—Sb—Se) or vanadium-antimony-selenium (V—Sb—Se). Further, the phase-change layer may include metals alloyed with an element from each of Groups VA, e.g., antimony, and VIA e.g., sulfur, selenium, or tellurium, (also referred to as columns 15 and 16) of the period table in a tertiary alloy such as tungsten-antimony-tellurium (W—Sb—Te), molybdenum-antimony-tellurium (Mo—Sb—Te), chrome-antimony-tellurium (Cr—Sb—Te), tungsten-antimony-selenium (W—Sb—Se), molybdenum-antimony-selenium (Mo—Sb—Se) or chrome-antimony-selenium (Cr—Sb—Se).

Further, in addition to the representative examples of tertiary and quaternary alloys identified above, the chalcogenide alloy utilized in the phase-change layer may be a binary phase-change chalcogenide alloy such as one or more of Ga—Sb, In—Sb, In—Se, Sb—Te or Ge—Te alloys. Other quaternary phase-change chalcogenide alloys may include one or more of an Ag—In—Sb—Te, (Ge—Sn)—Sb—Te, Ge—Sb—(Se—Te) or $Te_{0.81}Ge_{0.15}Sb_{0.02}S_{0.02}$ alloy, for example.

The phase change material layer 114 may be formed by a sputtering method. When conventional sputtering processes, the relatively poor step coverage associated with conventional sputtering methods tends to prevent the formation of a conformal layer of the phase change material. As a result, the deposited phase change material may form an overhang adjacent the upper portion, lip or edge C of the via hole 112 as shown in FIG. 5. Accordingly, if the sputter deposition of the phase change material layer 114 continues, the opening of the via hole 112 will tend to close before the via hole is completely filled, thereby forming a void or other defect that will tend to depress manufacturing yield and/or compromise the reliability of the resulting semiconductor memory devices and equipment that incorporates such devices.

Figure 6:
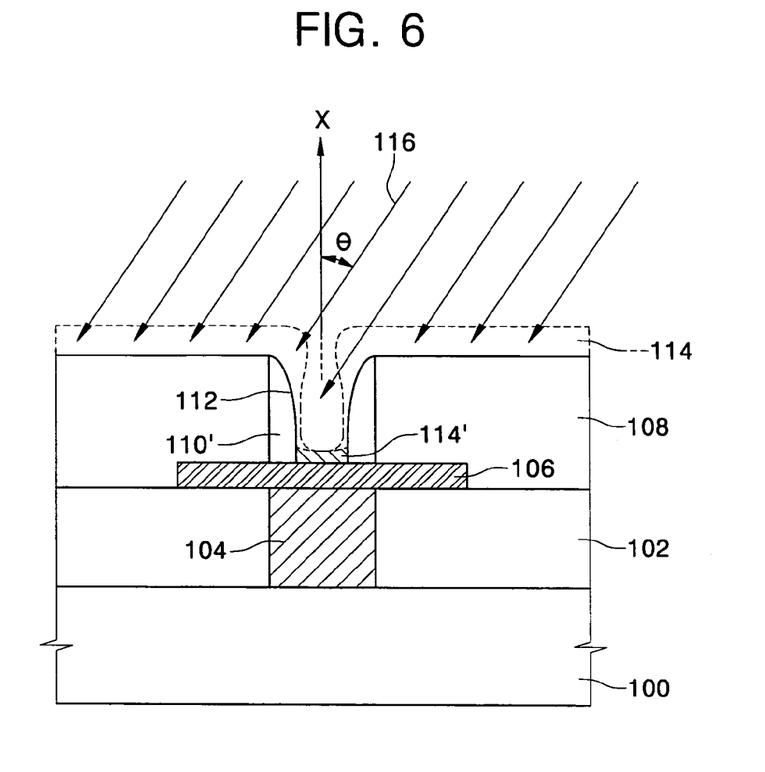

As illustrated in FIGS. 1 and 6, the phase change material layer 114 formed at the upper portion C of the via hole 112 and on the molding insulating layer 108 is removed to form a phase change material layer pattern 114' on at least a bottom surface of the via hole 112 (S6). The excess phase change material layer 114 may be removed using an ion beam etching (IBE) process (S6 of FIG. 1). During the IBE process S6, the incident angle of an ion beam 116 incident on the semiconductor substrate may be set or adjusted whereby the ion beam is offset from a longitudinal axis of the via hole 112 and thereby differs from conventional plasma type blanket anisotropic etching.

As illustrated in FIG. 6, embodiments of the invention will utilize an ion beam 116 incident on the phase change material layer 114 at a incident angle with respect to an open axis X of the via hole 112. That is, the ion beam 116 is inclined relative to the main axis of the via hole 112 at an incident angle $\theta$ that is selected whereby the bottom surface of the via hole, and that portion of the phase change material 114 that will remain in the via hole, are protected from direct incidence of the ion beam. The longitudinal opening axis X of the via hole 112 is aligned in an opening direction and serves as a reference axis for determining the incident angle $\theta$ at which the ion beam 116 strikes the surface of the semiconductor device or other substrate.

Figure 7:
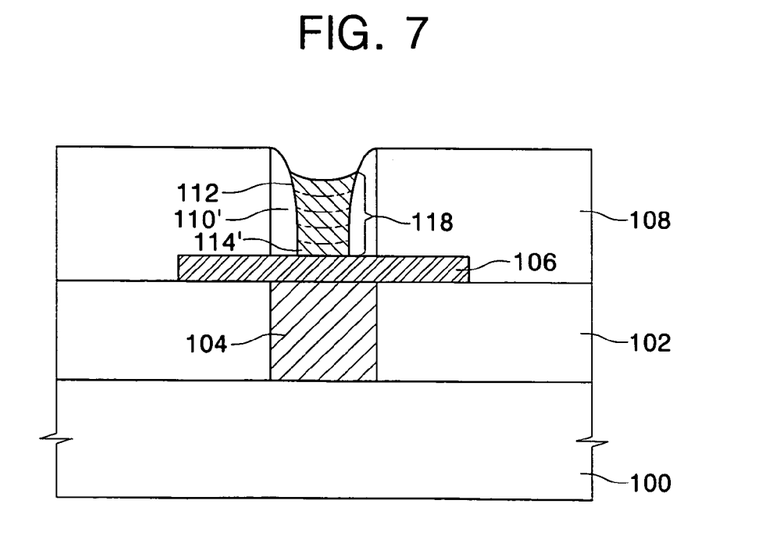

Depending on the aspect ratio of the via holes provided on the semiconductor memory device, the incident angle $\theta$ ion beam 116 should be sufficient to avoid directing the ion beam 116 at the bottom surface of the via hole. As illustrated in FIG. 6, the ion beam 116 is prevented from reaching the bottom surface of the via hole because it is blocked by the molding insulating layer 108 and/or the portion of the phase change material layer 114, at least during the early stages of the ion beam treatment. As illustrated in FIGS. 6 and 7, that portion of the phase change material layer 114 formed adjacent the upper region, lip or edge C of the via hole 112 is selectively etched.

As a result, a phase change material layer pattern 114' is formed in the via hole 112. In this case, the phase change material layer formed on the top surface of the molding insulating layer 108 is also etched while the phase change material layer at the top upper region C of the via hole 112 is etched to expose a top or upper surface of the molding insulating layer 108. Alternatively, the IBE process S6 may be carried out under conditions and/or of limited duration sufficient to leave at least a portion of the phase change material layer 114 having a thickness on the top surface of the molding insulating layer 108.

The incident angle $\theta$ of the ion beam 116 may be selected from a range of angles that are both sufficient for blocking the ion beam from being incident on the bottom surface of the via hole 112, e.g., a minimum angle, while still providing an acceptable etch rate for the phase change material and/or other materials. Those skilled in the art will be familiar with balancing the effects of the IBE to ensure that material deposited in the lower portion of the via hole is adequately protected while still providing a satisfactory etch rate on the material deposited on the surface of the molding insulating layer.

As will be appreciated by those skilled in the art, the minimum incident angle $\theta$ will be a function of the aspect ratio of the via holes formed through the molding insulating layer. Accordingly, the range of acceptable incident angles $\theta$ will vary depending on the aspect ratio of the particular via holes 112. For example, as the aspect ratio of the via hole 112 increases, the minimum value of the incident angle $\theta$ will decrease, thereby increasing the range of acceptable incident angles $\theta$. It is contemplated that in most instances, an ion beam 116 having an incident angle $\theta$ in a range of 30° to 85° will afford adequate protection for the material deposited in the lower portions of the via holes while still maintaining an acceptable etch rate (sometimes referred to as a material removal rate (MRR)).

As will be appreciated, as the thickness or depth of the material deposited in the via holes increases, the effective "bottom" of the via hole moves closer to the surface and the effective aspect ratio can also tend to decrease. Accordingly, when a series of depositions and etches will be used to fill the via holes, the minimum incident angle $\theta$ may vary for each sequential etch process with the minimum incident angle $\theta$ tending to increase as the thickness of the deposited material increases and the "bottom" of the via hole 112 on which the material is being deposited moves closer to the surface of the molding insulating layer 108.

As illustrated in FIGS. 1 and 7, depositing the phase change material layer (S5 of FIG. 1) illustrated in FIG. 5 and the ion beam etch (IBE) (S6 of FIG. 1) illustrated in FIG. 6 are performed both sequentially and repeatedly (S7 of FIG. 1). As a result, the via plug 118 represents the combination or accumulation of the phase change material layer patterns 114' from at least two separate layers of phase change material formed in the via hole 112. The number of times the processes S5 and S6 will need to be repeated may be determined by considering the thickness of each of the separate layers of phase change material, the residual thickness from each of the layers of phase change material retained in the via hole after the etch process and the thickness of the final via plug 118 that will fill the via hole 112.

Because the processes S5 and S6 are repeated to from the via plug 118, the phase change material layer patterns 114' are sequentially stacked on the bottom surface of the via hole 112. As a result, each phase change material layer pattern 114' deposited tends to reduce the aspect ratio of the remaining open portion of via hole 112. With the reduced aspect ratio, subsequent phase change material layers 114 may more readily fill the via hole 112 having the decreased aspect ratio when the process S5 of depositing the phase change material layer 114 is repeated. In addition, as the processes S5 and S6 are repeated, thereby decreasing the aspect ratio of the via hole 112, the minimum value of the incident angle $\theta$ of the ion beam 116 during each subsequent IBE process will tend to increase accordingly.

As described above, when the IBE process S6 is performed in such a manner that a portion of the original phase change material layer 114 having a thickness remains on the top surface of the molding insulating layer, the phase change material layer remaining on the top surface of the molding insulating layer 108 will tend to protect the molding insulating layer during subsequent IBE processing as the processes S5 and S6 are repeated. By leaving a portion of the phase change material layer 114 in place, the underlying insulating material of the molding insulating layer 108 may be protected or shielded from being sputtered or, in some instances, resputtered, onto the top surface of the phase change material layer patterns 114' during the IBE process S6.

According to embodiments of the invention, the process S5 of depositing the phase change material layer and the process S6 of removing phase change material with an IBE are performed sequentially and repeatedly to form a via plug 118. As a result, embodiments of the invention can reduce the number defects conventionally associated with the via plug formation process even when the via hole 112 has a small diameter of, for example, 50 nm or less and/or an increased aspect ratio that would be difficult to accommodate successfully with a conventional process. By suppressing the formation of these defects, the embodiments of the process as reflected in the examples described herein will tend to product via plugs 118 having improved quality, performance and/or reliability. In addition, because via plugs 118 including a plurality of phase change material layer patterns 114' may be formed within the via hole 112 without utilizing a CMP process, even CMP sensitive phase change material layers may be utilizing in the process of forming the via plug. According to the examples described, embodiments of the process are able to suppress or prevent the thickness loss, erosion or other degradation associated with the application of conventional CMP processes to sensitive phase change materials such as GST.

Figure 9:
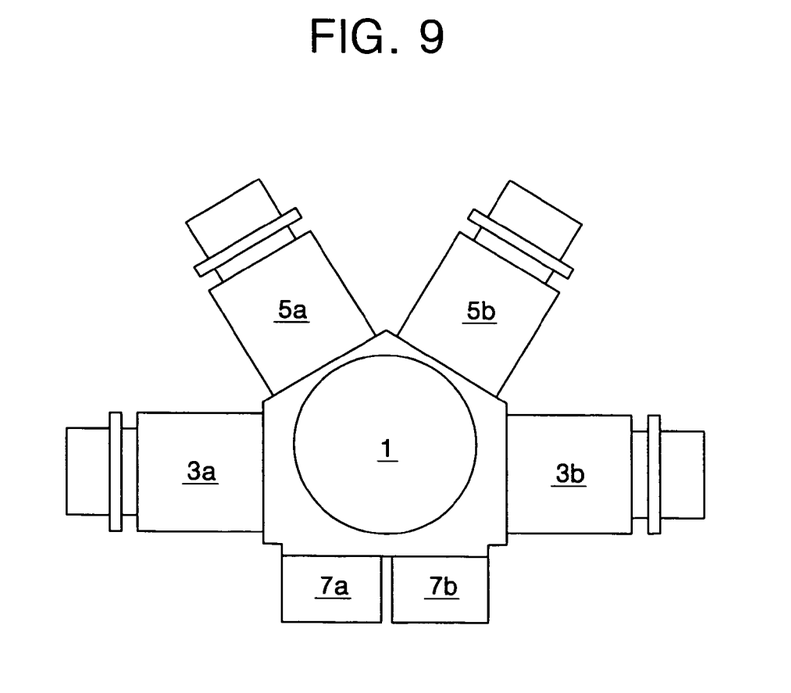
FIG. 9 is a schematic cross-sectional view of a multi-chamber apparatus used in accordance with one example embodiment of the invention.

Alternatively, as illustrated in FIG. 9, the process S5 of depositing the phase change material layer and the process S6 of performing the IBE etch may both be performed within a single multi-chamber apparatus in which sputtering chambers 5a and 5b and IBE chambers 3a and 3b are connected to a transfer chamber 1 in a clustered configuration. Reference numerals 7a and 7b denote load locks for introducing, and subsequently removing, wafer carriers or other wafer transporting assemblies from the deposition/etch apparatus.

Figure 10:
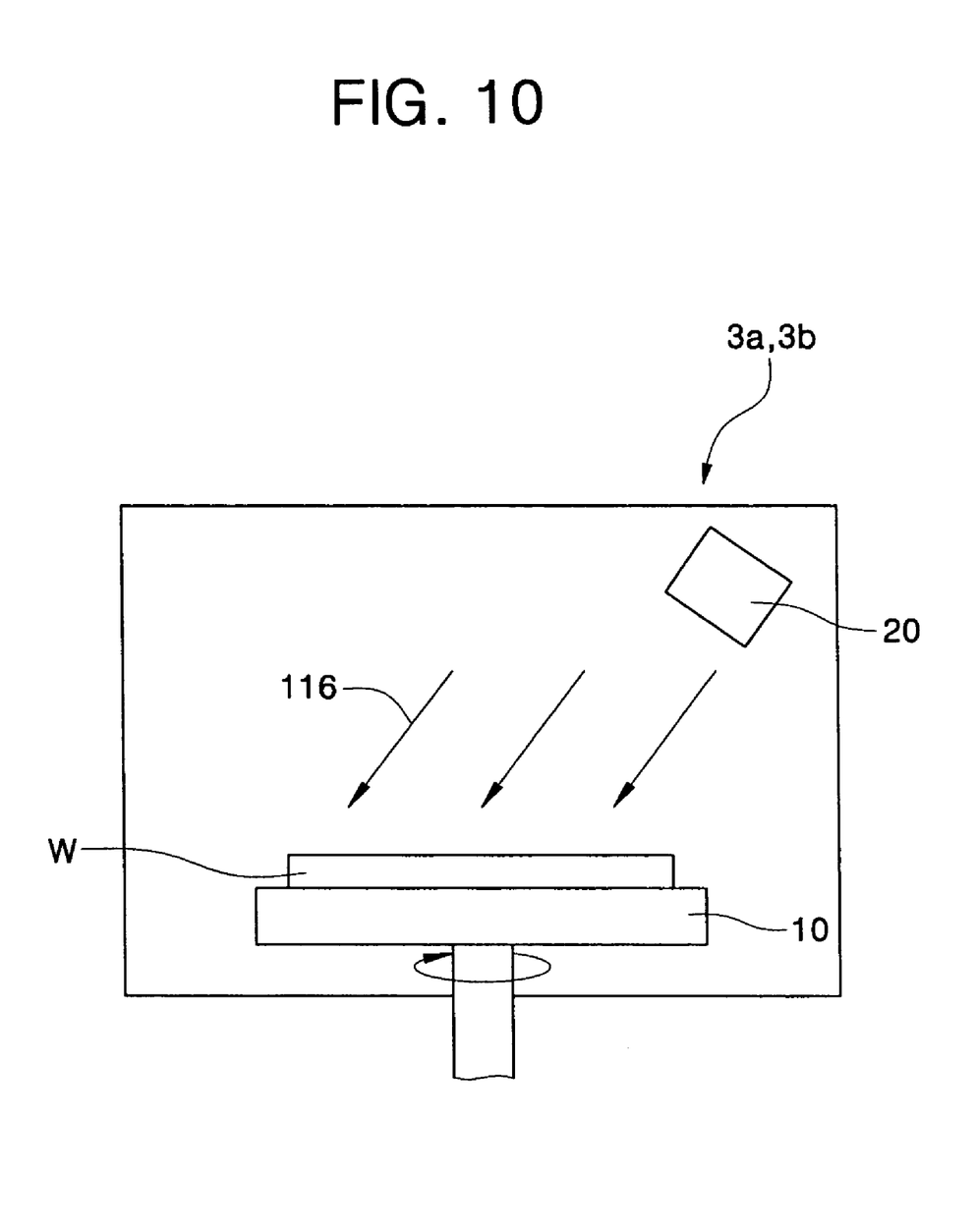
FIG. 10 is a schematic cross-sectional view illustrating an example embodiment of an ion-beam etch chamber according to FIG. 9.

FIG. 10 is a schematic cross-sectional view illustrating an example IBE chamber that could be utilized in the apparatus illustrated in FIG. 9.

As illustrated in FIG. 10, a semiconductor wafer W is fixed on a susceptor 10, chuck or other positioning device within an IBE chamber, such as 3a and/or 3b from FIG. 9. A phase change material layer (114 of FIG. 5) is deposited on the semiconductor wafer W as described with reference to FIG. 5. The IBE process is carried out using an ion beam 116 emitted from an ion gun 20 disposed in or on the IBE chambers 3a and 3b. The ion beam 116 includes sputter ions such as argon ions that will tend to remove material from all incident surfaces, the energy of the ions being sufficient for the selected sputter ions to tend to erode or etch the incident surface.

In this particular instance, as illustrated in FIG. 10, the susceptor 10 is rotated and/or otherwise moved relative to the ion gun 20 during the IBE for improving the uniformity of the IBE process across the surface of the semiconductor substrate. As a result, the overhanging portion of the phase change material layer that tends to form adjacent the upper or lip portion C of the via hole 112 may be removed in a generally uniform and efficient manner.

Figure 8:
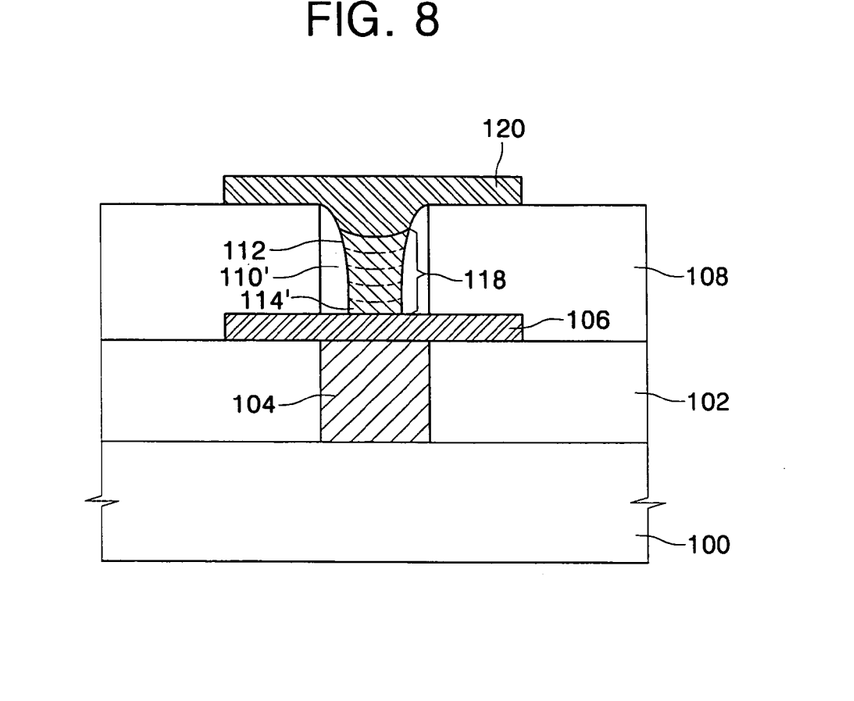

As illustrated in FIGS. 1 and 8, after the via plug 118 is formed by the accumulated phase change material layer patterns 114', a top electrode 120 is formed on the molding insulating layer 108 and the via plug 118. The top electrode 120 may be formed by forming a conductive layer for the top electrode such as a TiN layer on the semiconductor substrate having an exposed surface of the via plug 118, and forming a top electrode pattern on the conductive layer using a conventional photolithographic process. The patterned conductive layer can then be etched, using, for example, a conventional anisotropic etch process, to remove the unprotected portions of the conductive layer and thereby form the top electrode.

According to example embodiments of the invention, via plugs 118 are formed from a plurality of phase change material layer patterns 114' that fill or substantially fill the via hole 112. Accordingly, the phase change material layer patterns 114' are not subjected to an anisotropic etching process, unlike the via plug materials of the conventional fabrication processes. Accordingly, by avoiding or reducing etch damage to the via plug material, methods according to the example embodiments of the invention will tend to maintain or improve the operating characteristics and reliability of the final phase change memory device. Further, because the use of the plurality of phase change material layer patterns 114' tends to suppress the formation of voids and other defects within the via plugs 118, the operating characteristics and reliability of the final phase change memory device may be improved.

According to the example embodiments of the invention as detailed above, more reliable via plugs may be formed even in smaller via holes and/or via holes having increased aspect ratios. By improving the reliability of via plugs formed from phase change material layers, the example embodiments of the invention allow for increased integration and greater device density on phase change memory devices fabricated according to such methods.

Example embodiments of the invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of forming a plug structure, comprising:
   forming an insulating layer;
   forming an opening through the insulating layer, the opening having an aspect ratio, a longitudinal opening axis, a sidewall surface and a bottom surface;
   forming a first filling layer on an upper surface of the insulating layer and the sidewall surface and the bottom surface of the opening;
   removing an upper portion of the first filling layer while retaining a lower portion of the first filling layer within the opening, the lower portion of the first filling layer forming a partial plug covering the original bottom surface and a lower region of the sidewall surface to form a modified opening having a modified aspect ratio, wherein removing the upper portion of the first filling layer while retaining a lower portion of the first filling layer within the opening includes etching the upper portion of the first filling layer using ion beam etching (IBE), the ion beam having a first incident angle that is offset from the longitudinal opening axis so the ion beam does not directly strike the bottom surface of the opening;

forming a subsequent filling layer on the upper surface of the insulating layer, an upper portion of the sidewall surface and the partial plug;

removing an upper portion of the subsequent filling layer while retaining a lower portion of the subsequent filling layer within the modified opening, the lower portion of the subsequent filling layer forming an extension of the partial plug and covering an intermediate region of the sidewall surface, wherein removing the upper portion of the subsequent filling layer while retaining a lower portion of the subsequent filling layer within the opening includes etching the upper portion of the subsequent filling layer using ion beam etching (IBE), the ion beam having a second incident angle that is offset from the longitudinal opening axis; and repeating the forming of the subsequent filling layer and the removing of an upper portion of the subsequent filling layer processes as necessary to fill the opening with portions of a plurality of filling layers to form the plug structure.

2. The method of forming a plug structure as recited in claim 1, wherein:
the second incident angle is selected whereby the ion beam does not directly strike an upper surface of the partial plug.

3. The method of forming a plug structure as recited in claim 1, wherein:
the first incident angle is selected whereby the ion beam does not directly strike the lower portion of the first filling layer that forms the partial plug; and
the second incident angle is selected whereby the ion beam does not directly strike the lower portion of the subsequent filling layer that forms the extension of the partial plug.

4. The method of forming a plug structure as recited in claim 3, wherein:
the first filling layer is a conductive material; and
the subsequent filling layer is a conductive material.

5. The method of forming a plug structure as recited in claim 3, wherein:
the first filling layer is a phase change material; and
the subsequent filling layer is a phase change material.

6. The method of forming a plug structure as recited in claim 5, wherein:
the first filling layer is a first germanium-antimony-tellurium (GST) alloy represented by a formula $Ge_{1-(x+y)}Sb_xTe_y$, wherein x and y satisfy the expressions x>0, y>0 and (x+y)<1; and
the subsequent filling layer is a second germanium-antimony-tellurium (GST) alloy a formula $Ge_{1-(a+b)}Sb_aTe_b$ wherein a and b satisfy the expressions a>0, b>0 and (a+b)<1.

7. The method of forming a plug structure as recited in claim 6, wherein:

the first germanium-antimony-tellurium (GST) alloy and the second germanium-antimony-tellurium (GST) alloy have substantially the same composition.

8. The method of forming a plug structure as recited in claim 3, wherein:
the first incident angle has a first minimum value below which the ion beam will directly strike the lower portion of the first filling layer that forms the partial plug; and
the second incident angle has a second minimum value below which the ion beam will directly strike the lower portion of the subsequent filling layer that forms the extension of the partial plug, wherein the first minimum value is less than the second minimum value.

9. The method of forming a plug structure as recited in claim 3, wherein:
the first incident angle has a first minimum value below which the ion beam will directly strike the lower portion of the first filling layer that forms the partial plug, the first minimum value being a function of the aspect ratio of the opening; and
the second incident angle has a second minimum value below which the ion beam will directly strike the lower portion of the subsequent filling layer that forms the extension of the partial plug, the second minimum value being a function of the modified aspect ratio; wherein higher aspect ratios correspond to lower minimum values.

10. The method of forming a plug structure as recited in claim 3, wherein:
the first incident angle is within a range of 30° to 85°.

11. The method of forming a plug structure as recited in claim 1, wherein:
removing the upper portion of the first filling layer exposes the upper surface of the insulating layer; and
removing the upper portion of the subsequent filling layer exposes the upper surface of the insulating layer.

12. The method of forming a plug structure as recited in claim 1, wherein:
removing the upper portion of the first filling layer leaves a reduced thickness of the first filling layer over the upper surface of the insulating layer; and
removing the upper portion of the subsequent filling layer leaves a reduced thickness of the subsequent filling layer over the upper surface of the insulating layer.

13. A method of fabricating a phase change memory device, comprising, in order:
forming an insulating layer;
forming an opening through the insulating layer, the opening having an aspect ratio, a longitudinal opening axis, a sidewall surface and a bottom surface;
forming a first phase change filling layer on an upper surface of the insulating layer and the sidewall surface and the bottom surface of the opening;
removing an upper portion of the first phase change filling layer while retaining a lower portion of the first phase change filling layer within the opening, the lower portion of the first phase change filling layer forming a partial plug covering the original bottom surface and a lower region of the sidewall surface to form a modified opening having a modified aspect ratio,
wherein removing the upper portion of the first phase change filling layer while retaining a lower portion of the first phase change filling layer within the opening includes etching the upper portion of the first phase change filling layer using ion beam etching (IBE), the ion beam having a first incident angle that is offset from the longitudinal opening axis so the ion beam does not directly strike the bottom surface of the opening;

forming a subsequent phase change filling layer on the upper surface of the insulating layer, an upper portion of the sidewall surface and the partial plug;

removing an upper portion of the subsequent phase change filling layer while retaining a lower portion of the subsequent phase change filling layer within the modified opening, the lower portion of the subsequent phase change filling layer forming an extension of the partial plug and covering an intermediate region of the sidewall surface, wherein removing the upper portion of the subsequent phase change filling layer while retaining a lower portion of the subsequent phase change filling layer within the opening includes etching the upper portion of the subsequent phase change filling layer using ion beam etching (IBE), the ion beam having a second incident angle that is offset from the longitudinal opening axis; and repeating the forming of the subsequent phase change filling layer and the removing of an upper portion of the subsequent phase change filling layer processes as necessary to fill the opening with portions of a plurality of phase change filling layers to form a phase change plug structure.

14. The method of fabricating a phase change memory device according to claim 13, further comprising:
(a-2) forming an interlayer insulating layer on a semiconductor substrate; and
(a-1) forming a bottom electrode on the interlayer insulating layer; before forming the insulating layer (a), wherein the opening exposes a region of the bottom electrode.

15. The method of fabricating a phase change memory device according to claim 13, wherein:
the second incident angle is selected whereby the ion beam does not directly strike an upper surface of the partial plug.

16. The method of fabricating a phase change memory device according to claim 13, wherein:
the first incident angle is selected whereby the ion beam does not directly strike the lower portion of the first filling layer that forms the partial plug; and
the second incident angle is selected whereby the ion beam does not directly strike the lower portion of the subsequent filling layer that forms the extension of the partial plug.

17. The method of fabricating a phase change memory device according to claim 13, wherein:
the first phase change filling layer is a first germanium-antimony-tellurium (GST) alloy represented by a formula $Ge_{1-(x+y)}Sb_xTe_y$, wherein x and y satisfy the expressions $x>0$, $y>0$ and $(x+y)<1$; and
the subsequent phase change filling layer is a second germanium-antimony-tellurium (GST) alloy a formula $Ge_{1-(a+b)}Sb_aTe_b$, wherein a and b satisfy the expressions $a>0$, $b>0$ and $(a+b)<1$.

18. The method of fabricating a phase change memory device according to claim 13, further comprising:
forming a top electrode in electrical contact with the phase change plug structure, the top electrode overlaying a region of the upper surface of the insulating layer adjacent the phase change plug structure.

* * * * *